United States Patent
Ide et al.

(10) Patent No.: US 10,774,012 B2
(45) Date of Patent: *Sep. 15, 2020

(54) SUBSTRATE/ORIENTED APATITE-TYPE COMPOSITE OXIDE FILM COMPLEX AND METHOD FOR PRODUCING SAME

(71) Applicant: Mitsui Mining & Smelting Co., Ltd., Tokyo (JP)

(72) Inventors: Shingo Ide, Ageo (JP); Yasuhisa Izutsu, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/741,637

(22) PCT Filed: Jul. 7, 2016

(86) PCT No.: PCT/JP2016/070083
§ 371 (c)(1),
(2) Date: Jan. 3, 2018

(87) PCT Pub. No.: WO2017/018149
PCT Pub. Date: Feb. 2, 2017

(65) Prior Publication Data
US 2018/0186704 A1    Jul. 5, 2018

(30) Foreign Application Priority Data
Jul. 30, 2015 (JP) .................................. 2015-150434

(51) Int. Cl.
*H01B 1/06* (2006.01)
*C04B 41/87* (2006.01)
(Continued)

(52) U.S. Cl.
CPC .............. *C04B 41/87* (2013.01); *C23C 14/08* (2013.01); *C23C 14/34* (2013.01);
(Continued)

(58) Field of Classification Search
CPC ......... C04B 41/87; C23C 14/08; C23C 14/34; C23C 14/58; C23C 14/5806;
(Continued)

(56) References Cited

U.S. PATENT DOCUMENTS

2004/0161651 A1    8/2004    Higuchi et al.
2010/0248073 A1    9/2010    Higuchi et al.
2013/0052445 A1    2/2013    Nakada et al.

FOREIGN PATENT DOCUMENTS

JP    339468 A    2/1991
JP    8208333 A    8/1996
(Continued)

OTHER PUBLICATIONS

Machine Translation Nakata et al. (JP 2013-064194) (Year: 2013).*
(Continued)

*Primary Examiner* — Rodney G McDonald
(74) *Attorney, Agent, or Firm* — The Webb Law Firm

(57) ABSTRACT

Provided is a substrate/oriented apatite-type composite oxide film complex which is suitable as a solid electrolyte for a battery, a sensor, a separation membrane, or the like, and can be produced inexpensively. Proposed is a substrate/oriented apatite-type composite oxide film complex provided with an oriented apatite-type composite oxide film on a substrate, wherein a film thickness of the oriented apatite-type composite oxide film is 10.0 µm or less, a degree of orientation (Lotgering method) thereof is 0.6 or more, and a material of the substrate at a side on which at least the oriented apatite-type composite oxide film is formed is a metal, an alloy, a ceramic, or a composite material thereof.

12 Claims, 2 Drawing Sheets

(51) Int. Cl.
  *C23C 14/08* (2006.01)
  *C23C 14/34* (2006.01)
  *C23C 14/58* (2006.01)
  *H01B 13/00* (2006.01)

(52) U.S. Cl.
  CPC .......... *C23C 14/3414* (2013.01); *C23C 14/58* (2013.01); *C23C 14/5806* (2013.01); *H01B 1/06* (2013.01); *H01B 13/00* (2013.01)

(58) Field of Classification Search
  CPC ...... C23C 14/3414; H01B 1/06; H01B 13/00; H01B 1/08
  USPC ........ 428/411.1; 204/192.15, 192.17, 192.22
  See application file for complete search history.

(56) References Cited

FOREIGN PATENT DOCUMENTS

| JP | 1072666 A | 3/1998 |
|---|---|---|
| JP | 10328292 A | 12/1998 |
| JP | 1171169 A | 3/1999 |
| JP | 2004244282 A | 9/2004 |
| JP | 2009213723 A | 9/2009 |
| JP | 201137662 A | 2/2011 |
| JP | 2013-64194 A | 4/2013 |
| JP | 201364194 A | 4/2013 |
| JP | 201365518 A | 4/2013 |
| JP | 2013184862 A | 9/2013 |
| JP | 2014148718 A | 8/2014 |
| JP | 5666404 B2 | 2/2015 |
| WO | 2009069685 A1 | 6/2009 |

OTHER PUBLICATIONS

Ueda et al. "c-Axis Oriented Apatite-type Silicates as Solid Electrolytes", ECS Transactions 57 (1) 1143-1149. (Year: 2013).*
Briois et al., "Synthesis and Characterization of Apatite Structure Sputter Deposited Coatings Dedicated to Intermediate Temperature Solid Oxide Fuel Cells", Journal of the Electrochemical Society, 2011, vol. 158:12, pp. B1479-B1484.
Oliveira et al., "Oxidation of magnetron sputtered La—Si thin films for solide oxide fuel cell electronlytes", Thin Solid Films, 2009, vol. 517, pp. 1895-1898.
M.M. Vieira, et al., Structure and ionic conductivity of reactively sputtered apatite-type lanthanum silicate thin films, Surface & Coatings Technology, 2014, pp. 14-19, vol. 247, Elsevier B.V.
Makishima et al., "Formation and Crystallization of Yttrium Aluminosilicate Glasses Containing Calcium Oxide", J. Am. Ceram. Soc., Jun. 1986, pp. C-130-C-131, vol. 69.
Mineshige, "Fabrication of an Oriented Glass-Ceramics Electrolyte", Grants-in-Aid for Scientific Research Result Report, 16 pages.
Uo et al., "The Effect of Rare-Earth Oxides on the Crystallization of CaO—Al2O3—SiO2 Glasses", Journal of Materials Science, 1998, pp. 749-754, vol. 33.

* cited by examiner

[Fig.1]
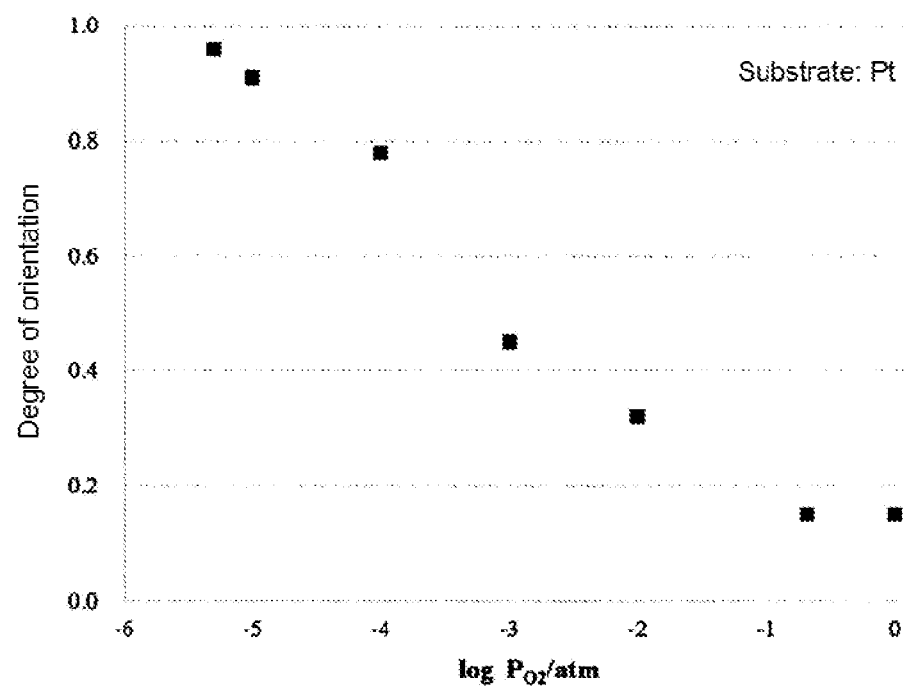

[Fig.2]
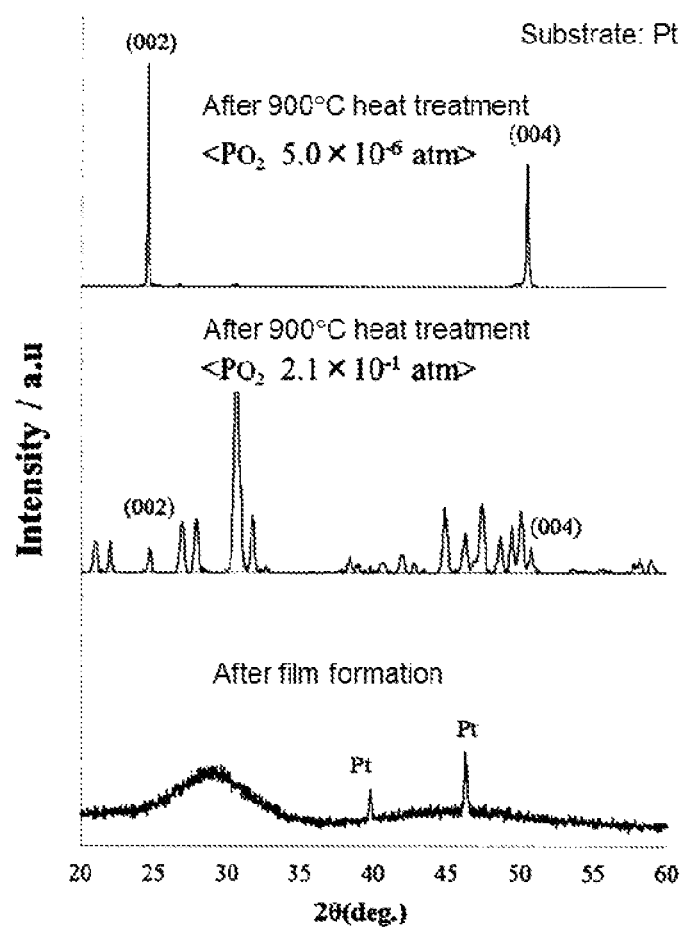

SUBSTRATE/ORIENTED APATITE-TYPE COMPOSITE OXIDE FILM COMPLEX AND METHOD FOR PRODUCING SAME

CROSS-REFERENCE TO RELATED APPLICATIONS

This application is the United States national phase of International Application No. PCT/JP2016/070083 filed Jul. 7, 2016, and claims priority to Japanese Patent Application No. 2015-150434 filed Jul. 30, 2015, the disclosures of which are hereby incorporated in their entirety by reference.

BACKGROUND ART

The present invention relates to a substrate/oriented apatite-type composite oxide film complex which is a complex of a substrate and an oriented apatite-type composite oxide film, and a method for producing the same. Particularly, the present invention relates to a substrate/oriented apatite-type composite oxide film complex which can be used as a battery such as a solid oxide fuel cell (SOFC), an ion battery, or an air battery and also as a solid electrolyte such as a sensor, or a separation membrane, and a method for producing the same.

TECHNICAL FIELD

Oxide ion conductors are a material which attracts attention as a functional ceramic usable in various electrochemical devices such as a solid electrolyte of batteries such as a solid oxide fuel cell (SOFC), an ion battery, and an air battery, a sensor, and a separation membrane. For example, the solid oxide fuel cell (SOFC) uses an oxide ion conductor as a solid electrolyte, the solid electrolyte is placed between an anode-side electrode and a cathode-side electrode, this is then sandwiched between a pair of separators, and thus a unit cell is constructed. An electric current is generated as oxide ions generated at the cathode-side electrode move to the anode-side electrode via the oxide ion conductor as a solid electrolyte.

Hitherto, as oxide ion conductors, Perovskite type oxides such as $LaGaO_3$ have been widely known as well as $ZrO_2$ having a fluorite type structure, in particular, stabilized $ZrO_2$ doped with $Y_2O_3$ has been widely used. A number of the oxide ion conductors of this type which have hitherto been known are a defect structure type in which an oxygen defect is introduced and an oxygen ion moves through this oxygen defect. In contrast, apatite-type oxide ion conductors such as $La_{10}Si_6O_{27}$ have been recently reported as an oxide ion conductor in which interstitial oxygen moves.

With regard to the apatite-type oxide ion conductor, for example, Japanese Patent Document JP 2004-244282 A discloses an oxide ion conductor which contains a trivalent element A, a tetravalent element B, and oxygen O as constituent elements, has a composition formula represented by $A_XB_6O_{1.5X+12}$ (where $8 \leq X \leq 10$), is composed of a composite oxide having an apatite-type crystal structure, and has an anisotropic oxygen ion conductivity.

Among such apatite-type oxide ion conductors, a lanthanum silicate-based oxide ion conductor is known as a solid electrolyte which exhibits high ion conductivity in the intermediate temperature region, and for example, a composition formula of $La_{9.33+x}Si_6O_{26+1.5x}$ or the like attracts attention.

A lanthanum silicate-based oxide ion conductor has an apatite structure exhibiting low symmetry, that is, high anisotropy and low activation energy for ion conduction, and it is thus said to be advantageous particularly for low temperature operation in the case of being used as a solid electrolyte of SOFC.

With regard to the lanthanum silicate-based oxide ion conductor of this type, for example, Japanese Patent Document JP H08-208333 A discloses an oxide ion conductor which contains $Ln_XSi_6O_{(3X/2)+12}$ (where Ln is a trivalent rare earth element of La, Ce, Pr, Nd, Sm, Eu, Gd, Tb, or Dy, and x is $6<x<12$) as the main component and has a crystal system of the main constituent phase of the sintered body calcined at 1,300° C. or more consisting of a hexagonal crystal.

Japanese Patent Document JP H11-71169 A discloses an oxide ion conductive ceramic which is a sintered body containing $(RE_2O_3)_x(SiO_2)_6$ (RE is an element selected from La, Ce, Pr, Nd, and Sm, and x satisfies the condition of $3.5<x<6$) calcined at a temperature of 1,700° C. or more as the main component and has an apatite crystal structure as the main constituent phase.

Meanwhile, since the lanthanum silicate-based oxide ion conductor exhibits anisotropic ion conductivity, it is possible to expect to further enhance the ion conductivity through orientation.

As a producing method capable of orienting a lanthanum silicate-based oxide ion conductor in one direction, a method to fabricate a single crystal of LSO by a floating zone method (FZ method) or the like or a method in which a $La_2O_3$ powder and a $SiO_2$ powder are mixed together and then subjected to a heat treatment at 700 to 1,200° C. to produce a porous material of a composite oxide, this porous material is pulverized into a powder, the powder is then mixed with a dispersion medium to form a slurry, this slurry is solidified in the presence of a magnetic field to form a molded body, this is then sintered at 1,400 to 1,800° C., thereby obtaining an ion conductive oriented ceramic in which the orientation directions of crystals are roughly matched has been proposed.

Japanese Patent Document JP 2011-37662 A discloses a method for producing an ion conductive oriented ceramic in which first, an oxide raw material containing an oxide powder of a lanthanoid and an oxide powder of at least either of Si or Ge is mixed (oxide raw material mixing step 51), the mixed oxide raw material is then heated and melted to be in a liquid state, this is casted and then rapidly cooled to obtain a glassy material G (melting vitrification step S2), and subsequently the glassy material G is crystallized through a heat treatment at 800 to 1,400° C. (crystallization step S3) in order to provide a method for producing an ion conductive oriented ceramic by which a large one can be easily obtained and ion conductivity can be improved although it requires a low cost and is a simple process.

Japanese Patent Document JP 2013-184862 A discloses a method to obtain an apatite-type lanthanum silicogermanate polycrystalline substance by heating a bonded body obtained by bonding a first layer containing $La_2Si_2O_7$ as the main component, a second layer containing $La_2[Si_{1-x}Ge_x]O_5$ (where x represents a number in the range of 0.01 to 0.333) as the main component, and a third layer containing La2Si2O7 as the main component in the order of the first layer/the second layer/the third layer at a temperature at which element diffusion occurs and removing the layers other than the layer that is positioned at the most intermediate position in the laminated structure generated after heating.

With regard to an electrolyte/electrode assembly using an oxide ion conductor as a solid electrolyte and a manufacturing method therefor, Japanese Patent Document JP 5666404 B1 discloses an electrolyte/electrode assembly in which a solid electrolyte comprising a single crystal of an apatite-type composite oxide in which the c-axis direction is oriented in a thickness direction or a polycrystalline substance of an apatite-type composite oxide in which the c-axis direction of each crystal grain is oriented in a thickness direction is interposed between an anode-side electrode and a cathode-side electrode, and also discloses a manufacturing method of the electrolyte/electrode assembly, wherein a solid electrolyte comprising a single crystal or a polycrystalline substance of an oriented apatite-type composite oxide is produced at first, and an anode-side electrode is then formed at an end face side of the solid electrolyte by a sputtering, a vapor deposition, or a pulse laser deposition method, while a cathode-side electrode is formed at another end face side of the solid electrolyte by a sputtering, a vapor deposition, or a pulse laser deposition method.

In addition, Japanese Patent Document JP 2013-64194 A relates to a method for producing a film comprising a composite oxide represented by a composition formula of $A_xB_6O_{1.5X+12}$ (where 6≤X≤30), and discloses a method for producing a composite oxide film, which comprises: a first process containing the steps of, onto a substrate, supplying a first material containing one of the elements A and B, supplying an oxidant to form a first layer containing an oxide of the one of the elements A and B, supplying a second material containing the other of the elements A and B, and supplying an oxidant to form a second layer containing an oxide of the other of the elements A and B; a second process containing layering a plurality of the first layers and a plurality of the second layers to obtain a laminate by repeating the steps of the first process; and a third process containing subjecting the substrate and the laminate to a heat treatment to form the composite oxide film.

Further, Patent Document WO 2009/069685 A discloses a so-called free-standing membrane electrolyte/electrode assembly in which an electrolyte is produced at first, and an anode-side electrode and a cathode-side electrode are then formed at each end face of the electrolyte respectively.

Problem to be Solved by the Invention

With regard to a conventionally known method for producing the substrate/oxide ion conductor film complex as described above, in fact, the usable substrate is limited to a silicon (Si) substrate, a crystal face of the substrate is needed to utilize, the substrate is needed to be comprised of a single crystal, and thus it is necessary to use a special substrate. This is because, by using such a special substrate, the oxide ion conductor can be oriented by the influence of the substrate, and a thickness direction between a cathode-side electrode and an anode-side electrode and a direction to which oxide ions are conducted can be matched by using a single crystal (for example, see the paragraph [0023] of Patent Document 7). However, the substrate/oxide ion conductor film complex which uses such a special substrate has a problem to be used as an electrode-solid electrolyte of a fuel cell (SOFC). For example, the silicon (Si) substrate is not preferable as an electrode, it is difficult to form a thin electrolyte layer when it is a free-standing membrane electrolyte/electrode assembly which forms an electrode or the like on a single crystal substrate, and also there is a tendency to be expensive.

In addition, when it is assumed that the substrate/oxide ion conductor film complex is used as a solid electrolyte, it is required that a thickness of the oxide ion conductor is minimized as much as possible to be a thin film shape and a migration length of the oxide ion is reduced in order to improve oxide ion conductivity by reducing an electric resistance or a diffusion resistance which occurs inside the electrolyte.

Thus, the present invention provides a novel substrate/oxide ion conductor film complex which can be used as a solid electrolyte and can be easily produced, and also provides a novel producing method in which a thin film composed of an oriented apatite-type composite oxide can be formed on the substrate without being restricted by materials of the substrate.

SUMMARY OF THE INVENTION

The present invention proposes a substrate/oriented apatite-type composite oxide film complex comprising an oriented apatite-type composite oxide film on a substrate, wherein a film thickness of the oriented apatite-type composite oxide film is 10.0 μm or less, a degree of orientation (Lotgering method) thereof is 0.6 or more, and a material of the substrate at a side on which at least the oriented apatite-type composite oxide film is formed is a metal, an alloy, a ceramic, or a composite material thereof.

In addition, the present invention relates to a method for producing the substrate/oriented apatite-type composite oxide film complex, and proposes a method for producing the substrate/oriented apatite-type composite oxide film complex, wherein an amorphous composite oxide film is formed on a substrate by using a target having a relative density of 80% or more and comprising a composite oxide having the same constitutive element as the amorphous composite oxide film to be formed by a sputtering method, the amorphous composite oxide film is then heated and subjected to a heat treatment at 800° C. or more under an atmosphere in which an oxygen partial pressure is 1.0×10-4 atm or less, and thus the amorphous composite oxide film is crystallized as an apatite structure and oriented.

Furthermore, the present invention relates to a sputtering target for forming an amorphous composite oxide thin film on a substrate, and proposes a sputtering target having a relative density of 80% or more, which is a composite oxide represented by a general formula: $A_{9.33+x}[T_{6-y}M_y]O_{26.00+z}$ (where A in the formula represents one or two or more elements selected from the group consisting of La, Ce, Pr, Nd, Sm, Eu, Gd, Tb, Dy, Be, Mg, Ca, Sr, and Ba; T in the formula represents an element including Si, Ge, or both of them; and M in the formula represents one or two or more elements selected from the group consisting of Mg, Al, Sc, Ti, V, Cr, Mn, Fe, Co, Ni, Ga, Y, Zr, Ta, Nb, B, Ge, Zn, Sn, W, and Mo.), in which x in the formula is −1.33 to 1.50, y in the formula is 0 to 3, z in the formula is −5.0 to 5.2, and a ratio (A/T) of a molar number of A to a molar number of T is 1.3 to 3.61.

The substrate/oriented apatite-type composite oxide film complex proposed by the present invention can be used as a solid electrolyte, and can be easily produced. Hence, the substrate/oriented apatite-type composite oxide film complex proposed by the present invention can be suitably used as a solid electrolyte of batteries such as a fuel cell (SOFC), an ion battery, and an air battery, a sensor, and a separation membrane in particular.

In addition, in the method for producing the substrate/oriented apatite-type composite oxide film complex proposed by the present invention, a thin film composed of an oriented apatite-type composite oxide having high degree of orientation can be formed on the substrate by performing a heat treatment under the control of oxygen partial pressure without being restricted by materials of the substrate. Thus, a thin film composed of an oriented apatite-type oxide can be formed on the substrate without being restricted by materials of the substrates such as various kinds of metal substrates and a ceramic substrate. More specifically, enhancement of power generation characteristics can be expected since a thin film having high degree of orientation can be formed on, for example, a Ni cermet which is an anode-side electrode of fuel cells. In addition, applications for an oxygen sensor and the like can also be expected since it is possible to form an oriented thin film on various kinds of metal substrates. Furthermore, it is also possible to form an oriented film on substrates having various shapes such as a cylindrical shape.

BRIEF DESCRIPTION OF DRAWINGS

FIG. 1 is a graph illustrating degrees of orientation of the apatite-type composite oxide films (film thickness of 3 μm) and oxygen partial pressure dependency in 900° C. heat treatment with regard to Examples and Comparative Examples which use a Pt substrate; and Comparative Examples which use a Pt substrate.

FIG. 2 shows X-ray diffraction patterns of the substrate/oriented apatite-type composite oxide film complexes obtained in Example 6 and Comparative Example 1.

DETAILED DESCRIPTION OF THE INVENTION AND MODE(S) FOR CARRYING OUT SAME

Next, the present invention will be described based on embodiments. However, the present invention is not limited to the embodiments that will be described below.

<The Present Substrate/Oriented Apatite-Type Composite Oxide Film Complex>

The substrate/oriented apatite-type composite oxide film complex according to an example of the present embodiment (referred to as the "present substrate/oriented apatite-type composite oxide film complex") is a complex having an oriented apatite-type composite oxide film on a substrate.

(Substrate)

With regard to a substrate in the present substrate/oriented apatite-type composite oxide film complex, the material is not particularly limited. Examples of the material of the substrate may include metals such as Pt, Au, Ni, Ag, Pd, and Si or an alloy containing them, a metal oxide such as $ZrO_2$, YSZ (yttria-stabilized zirconia), LSO (lanthanum silicate), SDC (samaria-doped ceria), or a composite material thereof, such as a material composed of a cermet or the like containing Ni and ceramic.

Among them, since there is a tendency that a substrate which is not reacted with a film allows the degree of orientation of the film to be raised in the heat treatment step under the oxygen partial pressure atmosphere, a composite material of Pt, Au, Ni, Ag, Pd, YSZ, Ni and YSZ, a composite material of Ni and LSO, and a composite material of Ni and SDC are particularly preferable from such a viewpoint.

Incidentally, when a material of the substrate, particularly a material at a side where the amorphous composite oxide film is formed contains an element of Cu or Ti more than 50% by mass, a reaction with the film cannot be suppressed even under the oxygen partial pressure atmosphere, and thus there is difficulty in enhancing the degree of orientation of the apatite-type composite oxide film and such material is not preferable. Thus, as to the material of the substrate, particularly the material at a side where the amorphous composite oxide film is formed, the total content ratio of the element Cu or Ti is preferably 50% by mass or less, and more preferably 40% by mass or less.

The substrate in the present substrate/oriented apatite-type composite oxide film complex may be, for example, a material for the electrode. In addition, a material of the substrate at a side where particularly the oxide ion conductor film is formed may not be a material which utilizes a crystal face as in the conventional technology. The present substrate/oriented apatite-type composite oxide film complex is also characterized in that the material of the substrate at a side where at least the oxide ion conductor film is formed, for example, a non-oriented polycrystalline substance material or an amorphous material can be used as the substrate.

More specifically, a material which can be used, for example, as an anode-side electrode can also be used as the substrate. Example of the materials may include composite materials of metals such as Ni, Pt, an alloy of Pt and Co, an alloy of Ni and Co, and an alloy of Pt and Pd and an oxide ceramic, for example, a cermet of platinum or palladium and yttria-stabilized zirconia, a cermet of platinum or palladium and yttria-doped ceria, a cermet of platinum or palladium and samaria-doped ceria, and a cermet of platinum or palladium and gadolinia-doped ceria.

In addition, a material which can be used, for example, as a cathode-side electrode can also be used as the substrate. Examples of the material may include oxides or ceramics such as LaSrCoFeO (LSCF), BaSrCoFeO (BSCF), and SmSrCoO, and a cermet of these oxides or ceramics and the metals.

A thickness of the substrate is preferably 10 to 500 μm from the viewpoint of sufficiently maintaining a substrate strength and keeping an electric resistance low. Among them, it is more preferably 20 μm or more or 300 μm or less.

(Oriented Apatite-Type Composite Oxide Film)

The oriented apatite-type composite oxide film is preferably a film composed of a lanthanum silicate-based oxide ion conductor.

Since the lanthanum silicate-based oxide ion conductor is a solid electrolyte which exhibits high ion conductivity in the intermediate temperature region, has an apatite structure exhibiting low symmetry, that is, high anisotropy and low activation energy for ion conduction, and more particularly can maintain high oxygen ion conductivity even in the low temperature region (activation energy is low), it is advantageous particularly for low temperature operation in the case of being used as a solid electrolyte of SOFC or a sensor.

Examples of the lanthanum silicate-based oxide ion conductor may include a conductor comprising a composite oxide represented by a general formula: $A_{9.33+x}[T_{6-y}M_y]O_{26.00+z}$ (where A in the formula represents one or two or more elements selected from the group consisting of La, Ce, Pr, Nd, Sm, Eu, Gd, Tb, Dy, Be, Mg, Ca, Sr, and Ba; T in the formula represents an element including Si, Ge, or both of them; and M in the formula represents one or two or more elements selected from the group consisting of Mg, Al, Sc, Ti, V, Cr, Mn, Fe, Co, Ni, Ga, Y, Zr, Ta, Nb, B, Ge, Zn, Sn, W, and Mo.), in which x in the formula is −1.33 to 1.50, y in the formula is 0 to 3, z in the formula is −5.0 to 5.2, and a ratio (A/T) of a molar number of A to a molar number of T is 1.3 to 3.61.

In the formula (1), La, Ce, Pr, Nd, Sm, Eu, Gd, Tb, Dy, Be, Mg, Ca, Sr, and Ba which are listed as A are elements having a common point of being lanthanoids or alkaline earth metals which become ions having a positive charge and can constitute an apatite-type hexagonal structure.

Among these, from the viewpoint of further increasing the oxide ion conductivity, A is preferably a combination with one or two or more elements selected from the group consisting of La, Nd, Ba, Sr, Ca, and Ce, and among them, A is preferably La, Nd, or a combination of La with one or two or more elements selected from the group consisting of Nd, Ba, Sr, Ca, and Ce. Among these, the element A is particularly preferably La, Ce, or a combination of these elements.

In addition, T in the formula (1) may be an element including Si, Ge, or both of them.

The element M in the formula (1) is an element which can be contained as necessary for the purpose of further increasing oxygen ion conductivity, and examples of the element may include Mg, Al, Sc, Ti, V, Cr, Mn, Fe, Co, Ni, Ga, Y, Zr, Ta, Nb, B, Ge, Zn, Sn, W, and Mo.

The element may be one or two or more elements of these elements. Among these, the element M is particularly preferably an element of Ga, Al, and Mg, or a combination of two or more elements thereof.

In the formula (1): $A_{9.33+x}[T_{6-y}M_y]O_{26.00+z}$, x is preferably −1.33 to 1.50 from the viewpoint of increasing a degree of orientation and oxide ion conductivity. Among them, x is more preferably −1.00 or more or 1.00 or less, and even more preferably 0.00 or more or 0.70 or less.

From the viewpoint of being replaceable to an element T site in an apatite-type crystal lattice, y in the formula (1) is preferably 0 to 3. Among them, y is more preferably 0.5 or more or 2.5 or less, even more preferably 1 or more or 2 or less, and particularly preferably 1.00 or more or 1.80 or less.

From the viewpoint of keeping electrical neutrality in the apatite-type crystal lattice, z in the formula (1) is preferably −5.0 to 5.2. Among them, z is more preferably −4.0 or more or 4.0 or less, and even more preferably −3.0 or more or 3.0 or less.

In addition, in the formula (1), a ratio (A/T) of a molar number of A to a molar number of T is preferably 1.3 to 3.61 from the viewpoint of keeping a spatial occupation ratio in the apatite-type crystal lattice. Among them, it is more preferably 1.4 or more or 3.0 or less, and even more preferably 1.5 or more or 2.0 or less. Incidentally, when the ratio A/T is 3.61 or less, the oriented apatite-type composite oxide film can have an apatite structure.

The oriented apatite-type composite oxide film has features that it is being oriented.

Here, the term "oriented" of the oriented apatite-type composite oxide film means that the oriented apatite-type composite oxide film has an orientation axis and the orientation includes uniaxial orientation and biaxial orientation. It is preferable for the oriented apatite-type composite oxide film to have c-axis orientation.

A degree of orientation of the oxide ion conductor film, that is, a degree of orientation in which the oriented apatite-type composite oxide film is measured by a Lotgering method (Lotgering-degree of orientation) is preferably 0.6 or more from the viewpoint of oxide ion conductivity. Among them, it is more preferably 0.8 or more, and even more preferably 0.9 or more. Meanwhile, in the case of producing by a sputtering method, this degree of orientation is typically 0.999 or less, and more typically 0.99 or less. When the degree of orientation is in such range, the apatite-type composite oxide film can maintain excellent oxide ion conductivity.

An apatite-type compound can be an excellent solid electrolyte since the oxide ion conductivity in a c-axis direction of a unit lattice is high.

It is preferable that a thickness direction and the c-axis direction of the oriented apatite-type composite oxide film are matched, in other words, it is preferable to be c-axis oriented in a vertical direction to the substrate. Thereby, an excellent oxide ion conductivity along the thickness direction can be presented.

In order to match the thickness direction and the c-axis direction of the oriented apatite-type composite oxide film as described above, an amorphous composite oxide film is subjected to a heat treatment by controlling oxygen partial pressure such that a crystal having an apatite structure grows at a film surface opposite to the substrate, and thus a c-axis orientation in the thickness direction can be promoted, as described below.

In the oriented apatite-type composite oxide film, a residual stress of this film is preferably −3,500 to 0 MPa from the viewpoint of preventing a peeling from the substrate and preventing a crack or fracture occurred inside the coating. Among them, it is more preferably −3,100 MPa or more or −50 MPa or less.

Incidentally, the residual stress of the oriented apatite-type composite oxide film is a value measured by an X-ray diffraction method, and becomes a value of "−" in the case of compressive stress and a value of "+" in the case of tensile stress.

As a method for adjusting the residual stress of the oriented apatite-type composite oxide film to the range described above, for example, a method for controlling the thickness can be cited, as described below. In addition to the above, in case of film forming by a sputtering method, a method for controlling a pressure in a chamber in the film forming (in the plasma treating), that will be described below, can be cited. However, it is not limited to this method.

A film thickness of the oriented apatite-type composite oxide film is preferably 10.0 μm or less. When the film thickness of the oriented apatite-type composite oxide film is 10.0 μm or less, it is preferable since oxygen ions are easily passed through and a resistance along the thickness direction becomes smaller. In addition, the film thickness of the oriented apatite-type composite oxide film is preferably 0.2 μm or more from the viewpoint of preventing a peeling from the substrate, fracture, a short circuit, or the like.

From these viewpoints, the film thickness of the oriented apatite-type composite oxide film is preferably 10.0 μm or less. Among them, it is more preferably 0.2 μm or more or 7.0 μm or less, even more preferably 0.3 μm or more or 5.0 μm or less, particularly preferably 0.5 μm or more, and furthermore preferably 1.0 μm or more.

<Method for Producing the Present Substrate/Oriented Apatite-Type Composite Oxide Film Complex>

The present substrate/oriented apatite-type composite oxide film complex can be produced by, for example, the following method (referred to as the "present production method").

The present substrate/oriented apatite-type composite oxide film complex can be produced through a step (film forming step) in which a substrate/amorphous composite oxide film complex is formed by film forming an amorphous composite oxide film on a substrate, and a step (heat treatment step) in which the substrate/amorphous composite oxide film complex is heated and subjected to a heat treatment at 800° C. or more under an atmosphere where an oxygen partial pressure is $1.0 \times 10^{-4}$ atm or less, and thus the amorphous composite oxide film is crystallized as an apatite structure and oriented.

According to the production method as mentioned above, a thin film having high degree of orientation can be formed, and an oriented apatite-type composite oxide film having excellent oxide ion conductivity can be formed. Furthermore, it has also an advantage that the kinds of the substrate, that is, the materials are not limited. In the present production method, unlike a crystal growth method (epitaxial growth) which utilizes a crystal face of the substrate, the orientation of the amorphous composite oxide film progresses independently in a process of crystallizing the amorphous composite oxide film, and thus it is hardly affected by the substrate and a thin film having high degree of orientation can be formed. Specifically, since the method is not the one in which the apatite-type composite oxide film is oriented under the influence of the substrate by utilizing a lattice constant or a crystal face of the substrate, it is not necessary to limit the kinds (materials) of the substrate. Accordingly, even though the substrate in which the material at a side of forming the oriented apatite-type composite oxide film is a non-oriented polycrystalline substance material or an amorphous material, it can be used.

(Film Forming Step)

Examples of the film forming step may include an atomic layer deposition method, an ion plating method, a pulse laser deposition method, a plating method, a sputtering method, and a vapor deposition method. In addition, an amorphous oxide produced by a wet method such as a coprecipitation method or a sol-gel method can also be film formed by a screen printing method, a spin coat method, or the like. Among them, it is preferable to select a sputtering method from the viewpoints of film quality and productivity.

(Film Formation by Sputtering Method)

In the case of film forming by a sputtering method, a composite oxide (sintered body) having the same composition as the oriented apatite-type composite oxide film, in other words, the amorphous composite oxide film to be formed is used as a sputtering target, and the substrate is set at an opposite side electrode.

Then, by applying radio-frequency voltage between both the electrodes in the vacuum chamber, inert gas atoms are ionized and the ions collide with a surface of the target at high speed, particles of the material which constitutes the target are spattered and adhere to the substrate, the amorphous composite oxide film is formed on the substrate, and thus a substrate/amorphous composite oxide film complex can be formed.

The sputtering can be performed by using an existing sputtering apparatus.

In addition, a temperature of the substrate is raised by heating at a range of 300 to 500° C. in advance, and then the sputtering may be performed while maintaining the temperature.

Among the sputtering methods, it is preferable to employ a radio-frequency (RF) sputtering method on the point that an oxide target which is a high resistant body can be used.

The radio-frequency sputtering method is a method in which an inside of a chamber where a sputtering target and a substrate are being set is evacuated to vacuum, a radio-frequency power supply is then operated in a state of maintaining a prescribed pressure in the chamber by introducing gas into the chamber, and thus a plasma treating is performed.

At this time, a degree of vacuum at the evacuating is preferably $1 \times 10^{-5}$ to $1 \times 10^{-2}$ Pa, and a pressure in the chamber at the plasma treating is preferably 0.5 to 30 Pa. In addition, the replacement gas is preferably an inert gas such as Ar, He, Ne, Kr, Xe, or Rn. A reactive sputtering can also be performed by using a gas such as $O_2$ or $N_2$ as necessary.

A power density in the plasma treating is preferably 0.5 to 2.0 $W/cm^2$ from the viewpoint of effectively film forming while preventing an abnormal precipitation or a spark. Among them, it is more preferably 0.6 $W/cm^2$ or more or 1.8 $W/cm^2$ or less.

(Method for Producing Sputtering Target)

A composite oxide (sintered body) having the same constitutive element as the oriented apatite-type composite oxide film, that is, the amorphous composite oxide film to be formed may be used for the sputtering target. However, the amorphous composite oxide film and the composite oxide may not be composed of the same composition.

Further, the composite oxide (sintered body) may be composed of a single-phase apatite structure. However, it may contain a composite oxide other than the apatite structure which is constituted by an oxide of the element A, the element T, or the element M in the above formula, or two or more elements thereof.

For example, a sintered body comprising a composite oxide represented by a general formula: $A_{9.33+x}[T_{6-y}M_y]O_{26.00+z}$ (where A in the formula represents one or two or more elements selected from the group consisting of La, Ce, Pr, Nd, Sm, Eu, Gd, Tb, Dy, Be, Mg, Ca, Sr, and Ba; T in the formula represents an element including Si, Ge, or both of them; and M in the formula represents one or two or more elements selected from the group consisting of Mg, Al, Sc, Ti, V, Cr, Mn, Fe, Co, Ni, Ga, Y, Zr, Ta, Nb, B, Ge, Zn, Sn, W, and Mo.), in which x in the formula is −1.33 to 1.5, y in the formula is 0 to 3, z in the formula is −5.0 to 5.2, and a ratio (A/T) of a molar number of A to a molar number of T is 1.3 to 3.61 can be used as a sputtering target.

In addition, it has been confirmed that when a relative density of the sputtering target is 80% or more, a thin film (composite film) of a c-axis oriented apatite structure having high degree of orientation can be obtained after a heat treatment that will be described later. Thus, a relative density of the sputtering target is preferably 80% or more from such a viewpoint. Among them, it is more preferably 85% or more, and even more preferably 90% or more.

As a method for producing the sputtering target, it may be, for example, mixing appropriate raw materials, in particular, mixing the element A oxide and the element T oxide in the above formula, and the element M oxide as necessary, calcining, pulverizing and forming as necessary, and then producing a sintered body having a prescribed size by, for example, a hot press. However, the method is not limited to such a method.

At this time, the calcination of the mixed powder may be performed, for example, at 1,200 to 1,600° C. in the air, and the hot press may be performed, for example, by applying a pressure (for example, 45 kN) while heating at 1,200 to 1,600° C. under a nitrogen gas atmosphere.

(Heat Treatment Step)

The substrate/amorphous composite oxide film complex obtained as described above is further subjected to a heat treatment, and thus the amorphous composite oxide film of the substrate/amorphous composite oxide film complex can be crystallized as an apatite structure and oriented. Accordingly, the present substrate/oriented apatite-type composite oxide film complex can be produced. At this time, oxygen partial pressure and temperature in the heat treatment are important in controlling the degree of orientation of the apatite-type composite oxide film.

As a condition of the heat treatment, the oxygen partial pressure is preferably $1.0 \times 10^{-4}$ atm or less from the viewpoint that when an amorphous composite oxide film is subjected to a heat treatment under a condition of the prescribed oxygen partial pressure, the amorphous composite oxide film can be crystallized as an apatite structure and oriented.

On the other hand, the oxygen partial pressure is preferably $1.0 \times 10^{-6}$ atm or more from the point that the heat treatment step is efficiently (economically) processed. From such a viewpoint, the oxygen partial pressure of the treatment atmosphere in the heat treatment is preferably $1.0 \times 10^{-4}$ atm or less. Among them, it is more preferably $1.0 \times 10^{-6}$ atm or more or $1.0 \times 10^{-5}$ atm or less.

In contrast, for example, in the air (oxygen partial pressure: $2.1 \times 10^{-1}$ atm) or in an atmosphere where the oxygen partial pressure is $1.0 \times 10^{-3}$ atm or more, the element A (for example, La) and the substrate (for example, Ni) are reacted in advance before crystallizing $A_{9.33+x}[T_{6-y}M_y]O_{26.00+z}$ (also referred to as the "ATMO"), and a different phase such as LaNi oxide is then generated. Therefore, the oriented crystallization of the ATMO is hindered, and thus it is difficult to obtain an ATMO film having high degree of orientation.

Further, as to the temperature in the heat treatment, it is preferable to heat at 800° C. or more from the point that the amorphous composite oxide film is efficiently crystallized as an apatite structure. Among them, it is more preferable to heat at 850° C. or more or 1,200° C. or less, and even more preferable to heat at 900° C. or more or 1,100° C. or less.

The formed composite oxide film is obtained as an amorphous, and is crystallized by a heat treatment. However, when the temperature is less than 800° C., it requires a long time to proceed to the crystallization, and thus it is not efficient. In addition, when the heat treatment furnace is a muffle furnace, it is not easy to set a temperature over 1,200° C. A heating furnace capable of setting a temperature over 1,200° C. is generally expensive, and thus a cost of the equipment investment rises.

The present substrate/oriented apatite-type composite oxide film complex may have other members other than the substrate and the oriented apatite-type composite oxide film.

<Explanation of Words and Phrases>

In the present description, in the case of being expressed as "X to Y" (X and Y are arbitrary numbers), it includes the meaning of being "preferably greater than X" or "preferably smaller than Y" together with the meaning of being "X or more and Y or less" unless otherwise stated.

In addition, in the case of being expressed as "X or more" (X is an arbitrary number) or "Y or less" (Y is an arbitrary number), it also includes the intention to be "preferably greater than X" or "preferably less than Y".

EXAMPLES

Hereinafter, the present invention will be described in more detail based on the following Examples and Comparative Examples.

Example 1

$La_2O_3$, $SiO_2$, and $Ga_2O_3$ were blended so as to be a molar ratio of 4.8:5:0.5, ethanol is added thereto, and they were mixed together by using a ball mill. Thereafter, this mixture was dried, pulverized by using a mortar, and calcined at 1,300° C. for 3 hours under an air atmosphere by using a Pt crucible. Subsequently, ethanol was added to this calcined product, and the calcined product was pulverized by using a planetary ball mill, thereby obtaining a calcined powder.

Next, the calcined powder was placed in a molding machine having a diameter of 50 mmφ, and was hot-pressed by applying a pressure of 45 kN while heating at 1,500° C. under a nitrogen atmosphere, thereby producing a sputtering target.

From the results of the powder X-ray diffraction and the chemical analysis (ICP), it was confirmed that the obtained sputtering target had a structure of $La_{9.7}Si_{5.1}Ga_{0.9}O_{26.1}$ (La/Si=1.90), and the relative density (measured density/theoretical density (5.3 g/cm$^3$)×100) was 91%.

Next, an amorphous composite oxide film was formed on a substrate by a radio-frequency sputtering method. Specifically, the sputtering target and a Pt substrate were installed in a chamber, and a radio-frequency power supply was operated in a state where the inside of the chamber was maintained at 1.0 Pa by exhausting to a degree of vacuum of $1 \times 10^{-4}$ Pa or less in the chamber and by introducing Ar gas in the chamber. The supplied radio-frequency power was 30 W (power density: 1.53 W/cm$^2$), the film formation time was set to 180 minutes, and an amorphous composite oxide film was formed on the Pt substrate having a size of 10 mm×10 mm×0.1 mm, thereby producing a substrate/amorphous composite oxide film complex. Here, when the total amount of the Cu element and the Ti element which were contained in the Pt substrate was analyzed from an aqua regia dissolving solution of the substrate by the ICP emission spectroscopy method, it was 0.01% by mass or less.

Next, the substrate/amorphous composite oxide film complex obtained as described above was heated and subjected to a heat treatment at 900° C. under an atmosphere in which an oxygen partial pressure (measured by a zirconia type oxygen densitometer; the same applies hereafter) was $5.0 \times 10^{-6}$ atm, thereby producing a substrate/oriented apatite-type composite oxide film complex (sample) having a film thickness of 3.0 μm.

From the results of the powder X-ray diffraction and the chemical analysis (ICP), it was confirmed that the oriented apatite-type composite oxide film of the obtained substrate/oriented apatite-type composite oxide film complex (sample) had an apatite structure represented by $La_{9.7}Si_{5.1}Ga_{0.9}O_{26.1}$ (La/Si=1.90), and was c-axis oriented in the thickness direction of the film.

Examples 2 to 3

A substrate/oriented apatite-type composite oxide film complex (sample) was produced in the same manner as Example 1 except that $Al_2O_3$ or MgO was used instead of $Ga_2O_3$ in Example 1. However, since the raw material composition was changed, the relative density of the sputtering target was different from that of Example 1.

From the results of the powder X-ray diffraction and the chemical analysis (ICP), it was confirmed that the oriented apatite-type composite oxide film of the sputtering target and substrate/oriented apatite-type composite oxide film complex (sample) obtained in each of Examples had a film composition shown in Table 1. In addition, it was confirmed that the oriented apatite-type composite oxide film was c-axis oriented in the thickness direction of the film (the same applies to Examples that will be described later).

Example 4

$La_2O_3$ and $SiO_2$ were blended so as to be a molar ratio of 4.8:6.0, ethanol is added thereto, and they were mixed together by using a ball mill. Thereafter, this mixture was dried, pulverized by using a mortar, and calcined at 1,300°

C. for 3 hours under an air atmosphere by using a Pt crucible. Subsequently, ethanol was added to this calcined product, and the calcined product was pulverized by using a planetary ball mill, thereby obtaining a calcined powder.

Next, the calcined powder was placed in a molding machine having a diameter of 50 mmϕ, and was hot-pressed by applying a pressure of 45 kN while heating at 1,500° C. under a nitrogen atmosphere, thereby producing a sputtering target.

From the results of the powder X-ray diffraction and the chemical analysis (ICP), it was confirmed that the obtained sputtering target had a structure of $La_{9.6}Si_6O_{26.4}$ (La/Si=1.60).

Next, an amorphous composite oxide film was formed on a substrate by a radio-frequency sputtering method. Specifically, the sputtering target and a Pt substrate were installed (distance between target and substrate: 50 mm) in a chamber, and a radio-frequency power supply was operated in a state where the inside of the chamber was maintained at 1.0 Pa by exhausting to a degree of vacuum of $1\times10^{-4}$ Pa or less in the chamber and by introducing Ar gas in the chamber. The supplied radio-frequency power was 30 W, the film formation time was set to 180 minutes, and an amorphous composite oxide film was formed on the Pt substrate having a size of 10 mm×10 mm×0.1 mm, thereby producing a substrate/amorphous composite oxide film complex.

Next, the substrate/amorphous composite oxide film complex obtained as described above was subjected to a heat treatment at 900° C. under an atmosphere in which an oxygen partial pressure was $1.0\times10^{-5}$ atm, thereby producing a substrate/oriented apatite-type composite oxide film complex (sample) having a film thickness of 3.0 μm.

From the results of the powder X-ray diffraction and the chemical analysis (ICP), it was confirmed that the oriented apatite-type composite oxide film of the obtained substrate/oriented apatite-type composite oxide film complex (sample) had an apatite structure represented by $La_{9.6}Si_6O_{26.4}$ (La/Si=1.60), and was c-axis oriented in the thickness direction of the film (the same applies to Examples that will be described later).

Example 5

A substrate/oriented apatite-type composite oxide film complex (sample) was produced in the same manner as Example 4 except that the oxygen partial pressure in the heat treatment was changed to $1.0\times10^{-4}$ atm in Example 4.

Example 6

A substrate/oriented apatite-type composite oxide film complex (sample) was produced in the same manner as Example 4 except that the oxygen partial pressure in the heat treatment was changed to $5.0\times10^{-6}$ atm in Example 4.

Examples 7 to 14

A substrate/oriented apatite-type composite oxide film complex (sample) was produced in the same manner as Example 6 except that a kind of the substrate was changed as shown in Table 1 in Example 6. Here, when the total amount of the Cu element and the Ti element which were contained in the substrate was analyzed from an aqua regia dissolving solution of the substrate by the ICP emission spectroscopy method, it was 0.01% by mass or less.

Examples 15 to 17

A substrate/oriented apatite-type composite oxide film complex (sample) was produced in the same manner as Example 6 except that $La_2O_3$ and $SiO_2$ were blended by changing the molar ratio thereof in Example 6. However, since the raw material composition was changed, the relative density of the sputtering target was different from that of Example 6.

Examples 18 to 21

A substrate/oriented apatite-type composite oxide film complex (sample) was produced in the same manner as Example 6 except that the film thickness of the amorphous composite oxide film, that is, the film thickness of the oriented apatite-type composite oxide film was changed, that is, the film forming time was changed in Example 6.

Example 22

A substrate/oriented apatite-type composite oxide film complex (sample) was produced in the same manner as Example 6 except that the temperature when the sputtering target was produced was changed to 1,400° C. and the relative density of the sputtering target was changed in Example 6.

Example 23

A substrate/oriented apatite-type composite oxide film complex (sample) was produced in the same manner as Example 1 except that $CeO_2$ was used instead of $Ga_2O_3$ in Example 1.

Examples 24 to 26

A substrate/oriented apatite-type composite oxide film complex (sample) was produced in the same manner as Example 6 except that the film forming time of the amorphous composite oxide film was changed so that the film thickness varied as shown in Table 2 in Example 6.

Comparative Example 1

A substrate/oriented apatite-type composite oxide film complex (sample) was produced in the same manner as Example 6 except that the oxygen partial pressure in the heat treatment was changed to $2.1\times10^{-1}$ atm in Example 6. From the results of the powder X-ray diffraction and the chemical analysis (ICP), it was confirmed that the apatite-type composite oxide film of the sputtering target and substrate/oriented apatite-type composite oxide film complex (sample) obtained in Comparative Example 1 had a film composition shown in Table 1 and Table 2 (the same applies to Comparative Examples that will be described later).

Comparative Examples 2 to 3

A substrate/oriented apatite-type composite oxide film complex (sample) was produced in the same manner as Comparative Example 1 except that the kind of the substrate was changed as shown in Table 1 in Comparative Example 1.

Comparative Example 4

A substrate/oriented apatite-type composite oxide film complex (sample) was produced in the same manner as Example 6 except that the molar ratio of $La_2O_3$ and $SiO_2$ was changed as shown in Table 1 in Example 6. However, since the raw material composition was changed, the relative density of the sputtering target was different from that of Example 6.

Comparative Examples 5 to 7

A substrate/oriented apatite-type composite oxide film complex (sample) was produced in the same manner as Example 6 except that the oxygen partial pressure in the heat treatment was changed in Example 6.

Comparative Example 8

A substrate/oriented apatite-type composite oxide film complex (sample) was produced in the same manner as Example 6 except that the temperature when the sputtering target was produced was changed to 1,300° C. and the relative density of the sputtering target was changed in Example 6.

Comparative Example 9

A substrate/oriented apatite-type composite oxide film complex (sample) was produced in the same manner as Example 6 except that the film forming time of the amorphous composite oxide film was changed so that the film thickness varied as shown in Table 2 in Example 6.

<Method for measuring degree of orientation>

A degree of orientation f was calculated by the following formula (1) using a ratio ρ of the sum ($\Sigma I(001)$) of both peak intensities attributed to (002) and (004) of the apatite-type composite oxide with respect to the sum total ($\Sigma I(hkl)$) of all peak intensities of the apatite-type composite oxide obtained by the X-ray diffraction of the substrate/oriented apatite-type composite oxide film complex (sample) obtained in each of Examples and Comparative Examples. The diffraction peak having a diffraction angle 2θ(10 to 60°) was used (however, the diffraction pattern of the substrate was cancelled).

$$f=(\rho-\rho_0)/(1-\rho_0) \quad (1)$$

where, $\rho_0$: theoretical value of apatite structure crystal $\rho_0 = \Sigma I_0(001)/\Sigma I_0(hkl)$ ρ: measured value of oriented apatite sintered body $\rho = \Sigma I(001)/\Sigma I(hkl)$ <Method for Measuring Residual Stress>

A residual stress was measured by the following method. A crystal lattice spacing d of the film was calculated from a diffraction angle 2θ of (260) which is a peak of the diffraction image obtained by X-ray diffraction and a wavelength λ of X-ray, and a lattice strain ε was calculated by the following formula.

$$d=\lambda/(2 \sin \theta)$$

$$\varepsilon=(d-d_0)/d_0$$

Here, $d_0$ represents a value of the compound in a non-stress state, which is obtained from the database, International Centre for Diffraction Data (registered trademark) (ICDD(registered trademark)).

Based on this lattice strain ε, an angle 2θ (76 to 88°) was measured by changing a tilt angle ψ (−13 to 34°) of the film sample with respect to the crystal face. A residual stress σ was calculated from a Young's modulus E and a Poisson's ratio ν of the sample based on the following formula.

Here, the Young's modulus and the Poisson's ratio are values assumed as Young's modulus E=200 Gpa and Poisson's ratio ν=0.2 respectively. In addition, a residual stress value in an X direction was employed since the residual stress of the film had no anisotropy.

$$\varepsilon = \frac{1+v}{E}\sigma\sin^2\Psi - \frac{2v}{E}\sigma$$

<Method for Measuring Conductivity>

With regard to a measurement of conductivity of the substrate/oriented apatite-type composite oxide film complex (sample), a platinum film was formed on the upper electrode by a spattering method, a complex impedance (measuring device: Impedance Analyzer 1260 type, Solartron) at a frequency of 0.1 Hz to 32 MHz was measured under an air atmosphere (oxygen concentration of 20.9%) at 500° C., and a conductivity (S/cm) was then calculated. Incidentally, in this complex impedance measurement, an example which was inferior in coating property was determined as a short circuit since there was a case that a Cole-Cole plot could not be drawn as an equivalent circuit.

<Method for Evaluating Coating Property>

With regard to a coating property of the substrate/oriented apatite-type composite oxide film complex (sample), a surface observation was performed at an area of 5.0 mm square by an optical microscope in a magnification of 500 times, a coating property was evaluated according to the following criteria.

AA: No peeling or crack of the coating is observed (very good)

A: A peeling or crack in a size of 10 μm square or less is observed (good)

B: A peeling or crack in a size of 50 m square or less is observed (acceptable)

C: A peeling or crack in a size of over 100 m square is observed (not acceptable)

TABLE 1

| | Target relative density (%) | Film composition | Film composition (La/Si) | Film thickness <μm> | Substrate | Oxygen partial pressure PO$_2$ <atm> | Degree of orientation |
|---|---|---|---|---|---|---|---|
| Example 1 | 91 | La$_{9.7}$Si$_{5.1}$Ga$_{0.9}$O$_{26.1}$ | 1.90 | 3 | Pt | $5.0 \times 10^{-6}$ | 0.95 |
| Example 2 | 90 | La$_{9.5}$Si$_{5.1}$Al$_{0.9}$O$_{25.8}$ | 1.86 | 3 | Pt | $5.0 \times 10^{-6}$ | 0.96 |
| Example 3 | 86 | La$_{9.4}$Si$_5$MgO$_{25.1}$ | 1.88 | 3 | Pt | $5.0 \times 10^{-6}$ | 0.89 |
| Example 4 | 93 | La$_{9.6}$Si$_6$O$_{26.4}$ | 1.60 | 3 | Pt | $1.0 \times 10^{-5}$ | 0.91 |
| Example 5 | 93 | La$_{9.6}$Si$_6$O$_{26.4}$ | 1.60 | 3 | Pt | $1.0 \times 10^{-4}$ | 0.78 |
| Example 6 | 93 | La$_{9.6}$Si$_6$O$_{26.4}$ | 1.60 | 3 | Pt | $5.0 \times 10^{-6}$ | 0.96 |
| Example 7 | 93 | La$_{9.6}$Si$_6$O$_{26.4}$ | 1.60 | 3 | Au | $5.0 \times 10^{-6}$ | 0.95 |
| Example 8 | 93 | La$_{9.6}$Si$_6$O$_{26.4}$ | 1.60 | 3 | Ni | $5.0 \times 10^{-6}$ | 0.98 |
| Example 9 | 93 | La$_{9.6}$Si$_6$O$_{26.4}$ | 1.60 | 3 | Ag | $5.0 \times 10^{-6}$ | 0.95 |

TABLE 1-continued

| | Target relative density (%) | Film composition | Film composition (La/Si) | Film thickness <μm> | Substrate | Oxygen partial pressure PO$_2$ <atm> | Degree of orientation |
|---|---|---|---|---|---|---|---|
| Example 10 | 93 | La$_{9.6}$Si$_6$O$_{26.4}$ | 1.60 | 3 | Pd | $5.0 \times 10^{-6}$ | 0.91 |
| Example 11 | 93 | La$_{9.6}$Si$_6$O$_{26.4}$ | 1.60 | 3 | Ni—YSZ | $5.0 \times 10^{-6}$ | 0.87 |
| Example 12 | 93 | La$_{9.6}$Si$_6$O$_{26.4}$ | 1.60 | 3 | Ni—LSO | $5.0 \times 10^{-6}$ | 0.84 |
| Example 13 | 93 | La$_{9.6}$Si$_6$O$_{26.4}$ | 1.60 | 3 | Ni—SDC | $5.0 \times 10^{-6}$ | 0.85 |
| Example 14 | 93 | La$_{9.6}$Si$_6$O$_{26.4}$ | 1.60 | 3 | YSZ | $5.0 \times 10^{-6}$ | 0.75 |
| Example 15 | 90 | La$_{9.0}$Si$_6$O$_{25.5}$ | 1.50 | 3 | Pt | $5.0 \times 10^{-6}$ | 0.88 |
| Example 16 | 93 | La$_{10.0}$Si$_6$O$_{27}$ | 1.67 | 3 | Pt | $5.0 \times 10^{-6}$ | 0.95 |
| Example 17 | 95 | La$_{10.6}$Si$_6$O$_{26.2}$ | 1.80 | 3 | Pt | $5.0 \times 10^{-6}$ | 0.92 |
| Example 18 | 93 | La$_{9.6}$Si$_6$O$_{26.4}$ | 1.60 | 0.5 | Pt | $5.0 \times 10^{-6}$ | 0.88 |
| Example 19 | 93 | La$_{9.6}$Si$_6$O$_{26.4}$ | 1.60 | 1 | Pi | $5.0 \times 10^{-6}$ | 0.97 |
| Example 20 | 93 | La$_{9.6}$Si$_6$O$_{26.4}$ | 1.60 | 5 | Pt | $5.6 \times 10^{-6}$ | 0.98 |
| Example 21 | 93 | La$_{9.6}$Si$_6$O$_{26.4}$ | 1.60 | 10 | Pt | $5.0 \times 10^{-6}$ | 0.95 |
| Example 22 | 82 | La$_{9.6}$Si$_6$O$_{26.4}$ | 1.60 | 3 | Pt | $5.0 \times 10^{-6}$ | 0.74 |
| Comparative Example 1 | 93 | La$_{9.6}$Si$_6$O$_{26.4}$ | 1.60 | 3 | Pt | $2.1 \times 10^{-1}$ | 0.17 |
| Comparative Example 2 | 93 | La$_{9.6}$Si$_6$O$_{26.4}$ | 1.60 | 3 | Ni | $2.1 \times 10^{-1}$ | 0.21 (Different phase La$_2$NiO$_4$) |
| Comparative Example 3 | 93 | La$_{9.6}$Si$_6$O$_{26.4}$ | 1.60 | 3 | Ni—YSZ | $2.1 \times 10^{-1}$ | 0.20 (Different phase La$_2$NiO$_4$) |
| Comparative Example 4 | 79 | La$_{5.3}$Si$_6$O$_{25.5}$ | 1.05 | 3 | Pt | $5.0 \times 10^{-6}$ | <0.20 (Main phase La$_2$Si$_2$O$_7$) |
| Comparative Example 5 | 93 | La$_{9.6}$Si$_6$O$_{26.4}$ | 1.60 | 3 | Pt | $1.0 \times 10^{-3}$ | 0.45 |
| Comparative Example 6 | 93 | La$_{9.6}$Si$_6$O$_{26.4}$ | 1.60 | 3 | Pt | $1.0 \times 10^{-2}$ | 0.32 |
| Comparative Example 7 | 93 | La$_{9.6}$Si$_6$O$_{26.4}$ | 1.60 | 3 | Pt | $9.9 \times 10^{-1}$ | 0.15 |
| Comparative Example 8 | 75 | La$_{9.6}$Si$_6$O$_{26.4}$ | 1.60 | 3 | Pt | $5.0 \times 10^{-6}$ | 0.28 |

The term "YSZ" in Table 1 represents yttria-stabilized zirconia, the term "Ni-YSZ" represents a cermet of Ni and yttria-stabilized zirconia, the term "Ni-LSO" represents a cermet of Ni and lanthanum silicate, and the term "Ni-SDC" represents a cermet of Ni and samaria-doped ceria.

TABLE 2

| | Target relative density (%) | Film composition | Film composition (La/Si) | Film thickness <μm> | Substrate | Oxygen partial pressure PO$_2$ <atm> | Degree of orientation | Residual stress σx(MPa) | Coating property | Conductivity (S/cm) |
|---|---|---|---|---|---|---|---|---|---|---|
| Example 20 | 93 | La$_{9.6}$Si$_6$O$_{26.4}$ | 1.60 | 5 | Pt | $5.0 \times 10^{-6}$ | 0.98 | −1133 | AA | $5.1 \times 10^{-4}$ |
| Example 23 | 90 | La$_{8.5}$Ce$_{0.9}$Si$_6$O$_{26.1+x}$ | 1.42 | 3 | Pt | $5.0 \times 10^{-6}$ | 0.89 | −60 | AA | $6.6 \times 10^{-5}$ |
| Example 24 | 93 | La$_{9.6}$Si$_6$O$_{26.4}$ | 1.60 | 0.5 | Pt | $5.0 \times 10^{-6}$ | 0.79 | −196 | A | $8.4 \times 10^{-4}$ |
| Example 25 | 93 | La$_{9.6}$Si$_6$O$_{26.4}$ | 1.60 | 1 | Pt | $5.0 \times 10^{-6}$ | 0.85 | −601 | AA | $8.8 \times 10^{-5}$ |
| Example 26 | 93 | La$_{9.6}$Si$_6$O$_{26.4}$ | 1.60 | 7 | Pt | $5.0 \times 10^{-6}$ | 0.96 | −3089 | B | $9.5 \times 10^{-5}$ |
| Comparative Example 1 | 93 | La$_{9.6}$Si$_6$O$_{26.4}$ | 1.60 | 3 | Pt | $2.1 \times 10^{-1}$ | 0.17 | −887 | AA | $1.3 \times 10^{-6}$ |
| Comparative Example 9 | 93 | La$_{9.6}$Si$_6$O$_{26.4}$ | 1.60 | 11 | Pt | $5.0 \times 10^{-6}$ | 0.98 | −3621 | C | Short circuit |

(Consideration)

From Examples described above and the results of the tests which have been so far conducted by the inventors, it has been found that the substrate/oriented apatite-type composite oxide film complex can be more easily produced as compared with a conventional one when the substrate/oriented apatite-type composite oxide film complex comprises an oriented apatite-type composite oxide film on a substrate, wherein a degree of orientation (Lotgering method) of the oriented apatite-type composite oxide film is 0.6 or more, a film thickness thereof is 10.0 μm or less, and a material of the substrate at a side on which at least the oriented apatite-type composite oxide film is formed is a metal, an alloy, a ceramic, or a composite material thereof. Thus, the substrate/oriented apatite-type composite oxide film complex proposed by the present invention can be suitably used as a solid electrolyte of a battery such as a fuel cell (SOFC), an ion battery, or an air battery, a sensor, a separation membrane, and the like.

In addition, it has been found that when the substrate/oriented apatite-type composite oxide film complex is produced by the steps in which an amorphous composite oxide film is formed on a substrate by using a target having a relative density of 80% or more and comprising a composite oxide having the same constitutive element as the amorphous composite oxide film to be formed by a sputtering method, the amorphous composite oxide film is then heated and subjected to a heat treatment at 850° C. or more under an atmosphere in which an oxygen partial pressure is $1.0 \times 10^{-4}$ atm or less, and thus the amorphous composite oxide film is crystallized as an apatite structure and oriented, a thin film composed of an oriented apatite-type composite oxide having high degree of orientation can be formed on the substrate without being restricted by materials of the substrate since the oriented thin film which is hardly affected by the substrate can be produced by the heat treatment under the control of oxygen partial pressure.

The invention claimed is:

1. A substrate/oriented apatite-type composite oxide film complex comprising an oriented apatite-type composite oxide film on a substrate, wherein
the oriented apatite-type composite oxide film comprises a composite oxide represented by a general formula: $A_{9.33+x}[T_{6-y}M_y]O_{26.00+z}$ (where A in the formula represents one or two or more elements selected from the group consisting of La, Ce, Pr, Nd, Sm, Eu, Gd, Tb, Dy, Be, Mg, Sr, and Ba; T in the formula represents an element including Si, Ge, or both of them; and M in the formula represents one or two or more elements selected from the group consisting of Mg, Al, Sc, Ti, V, Cr, Mn, Fe, Co, Ni, Ga, Y, Zr, Ta, Nb, B, Ge, Zn, Sn, W, and Mo.), in which
x in the formula is −1.33 to 1.5,
y in the formula is 0 to 3,
z in the formula is −5.0 to 5.2, and
a ratio (A/T) of a molar number of A to a molar number of T is 1.3 to 3.61,
wherein a degree of orientation (Lotgering method) of the oriented apatite-type composite oxide film is 0.6 or more, and
a material of the substrate at a side on which at least the oriented apatite-type composite oxide film is formed is a metal, an alloy, a ceramic, or a composite material thereof.

2. The substrate/oriented apatite-type composite oxide film complex according to claim 1, wherein a conductivity of the substrate/oriented apatite-type composite oxide film complex under an air atmosphere at 500° C. is $6.6 \times 10^{-6}$ S/cm or more.

3. The substrate/oriented apatite-type composite oxide film complex according to claim 1, wherein a residual stress of the oriented apatite-type composite oxide film is −3,500 MPa to 0 MPa.

4. A substrate/oriented apatite-type composite oxide film complex comprising an oriented apatite-type composite oxide film on a substrate, wherein
the oriented apatite-type composite oxide film comprises a composite oxide represented by a general formula: $A_{9.33+x}[T_{6-y}M_y]O_{26.00+z}$ (where A in the formula represents one or two or more elements selected from the group consisting of La, Ce, Pr, Nd, Sm, Eu, Gd, Tb, Dy, Be, Mg, Sr, and Ba; T in the formula represents an element including Si, Ge, or both of them; and M in the formula represents one or two or more elements selected from the group consisting of Mg, Al, Sc, Ti, V, Cr, Mn, Fe, Co, Ni, Ga, Y, Zr, Ta, Nb, B, Ge, Zn, Sn, W, and Mo.), in which
x in the formula is −1.33 to 1.5,
y in the formula is 0 to 3,
z in the formula is −5.0 to 5.2, and
a ratio (A/T) of a molar number of A to a molar number of T is 1.3 to 3.61,
wherein a degree of orientation (Lotgering method) of the oriented apatite-type composite oxide film is 0.6 or more, and
a material of the substrate at a side on which at least the oriented apatite-type composite oxide film is formed is a metal, an alloy, a ceramic, or a composite material thereof, and
a conductivity of the substrate/oriented apatite-type composite oxide film complex under an air atmosphere at 500° C. is $6.6 \times 10^{-6}$ S/cm or more.

5. The substrate/oriented apatite-type composite oxide film complex according to claim 4, wherein a residual stress of the oriented apatite-type composite oxide film is −3,500 MPa to 0 MPa.

6. A substrate/oriented apatite-type composite oxide film complex comprising an oriented apatite-type composite oxide film on a substrate, wherein
the oriented apatite-type composite oxide film comprises a composite oxide represented by a general formula: $A_{9.33+x}[T_{6-y}M_y]O_{26.00+z}$ (where A in the formula represents one or two or more elements selected from the group consisting of La, Ce, Pr, Nd, Sm, Eu, Gd, Tb, Dy, Be, Mg, Sr, and Ba; T in the formula represents an element including Si, Ge, or both of them;
and M in the formula represents one or two or more elements selected from the group consisting of Mg, Al, Sc, Ti, V, Cr, Mn, Fe, Co, Ni, Ga, Y, Zr, Ta, Nb, B, Ge, Zn, Sn, W, and Mo.), in which
x in the formula is −1.33 to 1.5,
y in the formula is 0 to 3,
z in the formula is −5.0 to 5.2, and
a ratio (A/T) of a molar number of A to a molar number of T is 1.3 to 3.61,
wherein
a degree of orientation (Lotgering method) of the oriented apatite-type composite oxide film is 0.6 or more, and
a residual stress of the oriented apatite-type composite oxide film is −3,500 MPa to 0 MPa, and
a material of the substrate at a side on which at least the oriented apatite-type composite oxide film is formed is a metal, an alloy, a ceramic, or a composite material thereof.

7. The substrate/oriented apatite-type composite oxide film complex according to claim 1, wherein a film thickness of the oriented apatite-type composite oxide film is 1 μm or more and 5 μm or less.

8. A method for producing the substrate/oriented apatite-type composite oxide film complex of claim 1, the method comprising steps in which an amorphous composite oxide film is formed on a substrate by using a target having a relative density of 80% or more and comprising a composite oxide having the same constitutive element as the amorphous composite oxide film to be formed by a sputtering method, the amorphous composite oxide film is then heated and subjected to a heat treatment at 800° C. or more under an atmosphere in which an oxygen partial pressure is $1.0 \times 10^4$ atm or less, and thus the amorphous composite oxide film is crystallized as an apatite structure and oriented,
wherein the oriented apatite-type composite oxide comprises a composite oxide represented by a general formula: $A_{9.33+x}[T_{6-y}M_y]O_{26.00+z}$ (where A in the formula represents one or two or more elements selected from the group consisting of La, Ce, Pr, Nd, Sm, Eu, Gd, Tb, Dy, Be, Mg, [[Ca, ]]Sr, and Ba; T in the formula represents an element including Si, Ge, or both of them; and M in the formula represents one or two or more elements selected from the group consisting of Mg, Al, Sc, Ti, V, Cr, Mn, Fe, Co, Ni, Ga, Y, Zr, Ta, Nb, B, Ge, Zn, Sn, W, and Mo.), in which x in the formula is −1.33 to 1.5, y in the formula is 0 to 3, z in the formula is −5.0 to 5.2, and a ratio (A/T) of a molar number of A to a molar number of T is 1.3 to 3.61.

9. The method for producing the substrate/oriented apatite-type composite oxide film complex according to claim 8, wherein a material of the substrate on a side where at least the oriented apatite-type composite oxide film is formed is a non-oriented polycrystalline substance material or an amorphous material.

10. The method for producing the substrate/oriented apatite-type composite oxide film complex according to claim 8, wherein the amorphous composite oxide film is formed on the substrate by a radio-frequency sputtering method.

11. The method for producing the substrate/oriented apatite-type composite oxide film complex according to claim 8, wherein a conductivity of the substrate/oriented apatite-type composite oxide film complex under an air atmosphere at 500° C. is $6.6 \times 10^{-6}$ S/cm or more.

12. The method for producing the substrate/oriented apatite-type composite oxide film complex according to claim 8, wherein a residual stress of the oriented apatite-type composite oxide film is −3,500 MPa to 0 MPa.

* * * * *

UNITED STATES PATENT AND TRADEMARK OFFICE
CERTIFICATE OF CORRECTION

PATENT NO. : 10,774,012 B2
APPLICATION NO. : 15/741637
DATED : September 15, 2020
INVENTOR(S) : Shingo Ide et al.

It is certified that error appears in the above-identified patent and that said Letters Patent is hereby corrected as shown below:

In the Claims

Column 20, Line 57, Claim 8, delete "$1.0 \times 10^4$" and insert -- $1.0 \times 10^{-4}$ --, therefor Column 20, Line 64, Claim 8, after "Mg," delete "[[Ca, ]]"

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*